(12) United States Patent
Masaki

(10) Patent No.: US 9,095,048 B2
(45) Date of Patent: Jul. 28, 2015

(54) SHIELDING CASE AND IMAGING FORMING APPARATUS

(71) Applicant: KYOCERA Document Solutions Inc., Osaka (JP)

(72) Inventor: Akihiro Masaki, Osaka (JP)

(73) Assignee: KYOCERA DOCUMENT SOLUTIONS INC., Osaka-shi (JP)

( * ) Notice: Subject to any disclaimer, the term of this patent is extended or adjusted under 35 U.S.C. 154(b) by 104 days.

(21) Appl. No.: 13/752,801

(22) Filed: Jan. 29, 2013

(65) Prior Publication Data
US 2013/0195499 A1    Aug. 1, 2013

(30) Foreign Application Priority Data

Jan. 30, 2012  (JP) .................................. 2012-016367

(51) Int. Cl.
H05K 9/00     (2006.01)
G03G 21/20    (2006.01)

(52) U.S. Cl.
CPC ............. *H05K 9/0058* (2013.01); *G03G 21/20* (2013.01)

(58) Field of Classification Search
CPC ............................. H05K 9/0058; G03G 21/02
USPC .............. 399/90, 107; 174/32, 382, 377, 384, 174/350, 800; 361/800, 816, 818
See application file for complete search history.

(56) References Cited

U.S. PATENT DOCUMENTS

| | | | |
|---|---|---|---|
| 6,320,121 B1 * | 11/2001 | Honeycutt et al. ............. 174/384 |
| 6,754,088 B2 | 6/2004 | Takeda |
| 2003/0227760 A1 * | 12/2003 | Albayrak et al. ............. 361/800 |
| 2009/0273912 A1 * | 11/2009 | Myers et al. .................. 361/818 |

FOREIGN PATENT DOCUMENTS

| | | |
|---|---|---|
| JP | 63-178394 U | 11/1988 |
| JP | 2001-077575 A | 3/2001 |
| JP | 2002-043787 A | 2/2002 |
| JP | 2008-251693 A | 10/2008 |
| JP | 2009-229636 A | 10/2009 |

* cited by examiner

*Primary Examiner* — David Gray
*Assistant Examiner* — Sevan A Aydin
(74) *Attorney, Agent, or Firm* — Knobbe Martens Olson & Bear LLP

(57) ABSTRACT

A shield case includes a cabinet main body and a lid. The cabinet main body accommodates a board for mounting electronic components. The cabinet main body includes a main body side wall and a main body outer edge portion. The lid includes an opposed outer edge portion, a recessed portion and a plurality of contact points. The recessed portion includes opposed side wall portions that are disposed in an opposed configuration in relation to the main body side wall, and a lid bottom portion. A plurality of contact points is formed on the opposed side wall portions. The plurality of contact points is biased toward the main body side wall to form an electrical connection between the cabinet main body 401 and the lid.

8 Claims, 9 Drawing Sheets

SHIELDING CASE AND IMAGING FORMING APPARATUS

INCORPORATION BY REFERENCE

This application is based upon and claims the benefit of priority from the corresponding Japanese Patent Application No. 2012-016367, filed in the Japan Patent Office on Jan. 30, 2012, the entire contents of which are incorporated herein by reference.

BACKGROUND

This disclosure relates to a shielding case and an image forming apparatus provided with the same.

Conventionally, as a shielding case for an image forming apparatus such as a copying machine, printer or the like, a large number of a shielding cases includes, a cabinet main body that has an opening and accommodates a circuit board (board) that mounts electronic components, and a lid that is disposed to cover the opening of the cabinet main body. Electronic components or the like are mounted on the circuit board. The electronic components or the like that are mounted on the circuit board are used for controlling various members that configure the image forming apparatus.

In this regard, for the purpose of suppressing propagation and radiation of high frequency noise produced by an electronic component mounted on the circuit board, the cabinet main body and the lid may be joined by a plurality of threaded members or a another member for enhancing shield performance such as a gasket or the like may be mounted between the cabinet main body and the lid.

However, in such a instance, when the shielding case uses a plurality of screw members or when a another member is used to enhance the shield performance, there were cases where the cost was increased.

Furthermore, the cabinet main body or the lid may be formed in a shape to enhance the shield performance. For example, as a shielding case for an image forming device, a shielding case is known that includes a lid that has a projection in a hook-shaped configuration, and a lid that has an engaging portion configured to engage with the hook-shaped projection (Related Art 1).

However the shielding case in Related Art 1 causes contact between the lid and the cabinet main body due to the hooking action of the hook-shaped projection of the lid with the engaging portion of the cabinet main body. As a result, there is a possibility of an unstable contact pressure at the position of contact between the lid and the cabinet main body in the shielding case in Related Art 1. Therefore, the shield performance may become unstable. Consequently, there is a need for further enhancement of the shield performance in relation to a shielding case that includes a cabinet main body that has an opening and a lid that is disposed to cover the opening of the cabinet main body.

SUMMARY

This disclosure relates to a shielding case that includes a cabinet main body and a lid. The cabinet main body is an electrically conductive cabinet main body that accommodates a board for mounting electronic components, and has an opening. The cabinet main body includes a main body side wall and a main body outer edge portion. A part of the main body side wall forms the opening. The main body outer edge portion forms a connection with the end portion of the opening side in the main body side wall and extends to the outer side of the opening. The lid is an electrically conductive member that is disposed to cover the opening. The lid has opposed outer edge portions, a recessed portion and a plurality of contact points. The opposed outer edge portions are opposed to the main body outer edge portion. The recessed portion includes opposed side wall portions and a lid bottom portion. The opposed side wall portions are connected to the opposed outer edge portions and disposed in an opposed configuration in relation to the main body side wall. The outer edge of the lid bottom portion is connected to the end opposite the opposed outer edge portions in the opposed side wall portions. The plurality of contact points is formed on the opposed side wall portions, and are biased toward the main body side wall to form an electrical connection between the cabinet main body and the lid.

This disclosure relates to a shielding case that includes a cabinet main body, a lid, a fixing member and a plurality of contact points. The cabinet main body is an electrically conductive cabinet main body that accommodates a board for mounting electronic components, and has an opening. The lid is an electrically conductive member that is disposed to cover the opening. The fixing member is a fixing member for fixing the lid to the cabinet main body, and is displaced in a fitting direction for fitting the fixing member to fix the lid and the cabinet main body. The plurality of contact points is biased in a direction that is intersected with the fitting direction, and forms an electrical connection between the cabinet main body and the lid.

This disclosure relates to an imaging forming apparatus that includes an image forming unit for forming an image on an image forming material, an electrically conductive housing for accommodating the image forming unit, and a shielding case for forming an electrical connection with the housing.

DETAILED DESCRIPTION

The embodiments of this disclosure will be described below making reference to the figures.

Figure 1:
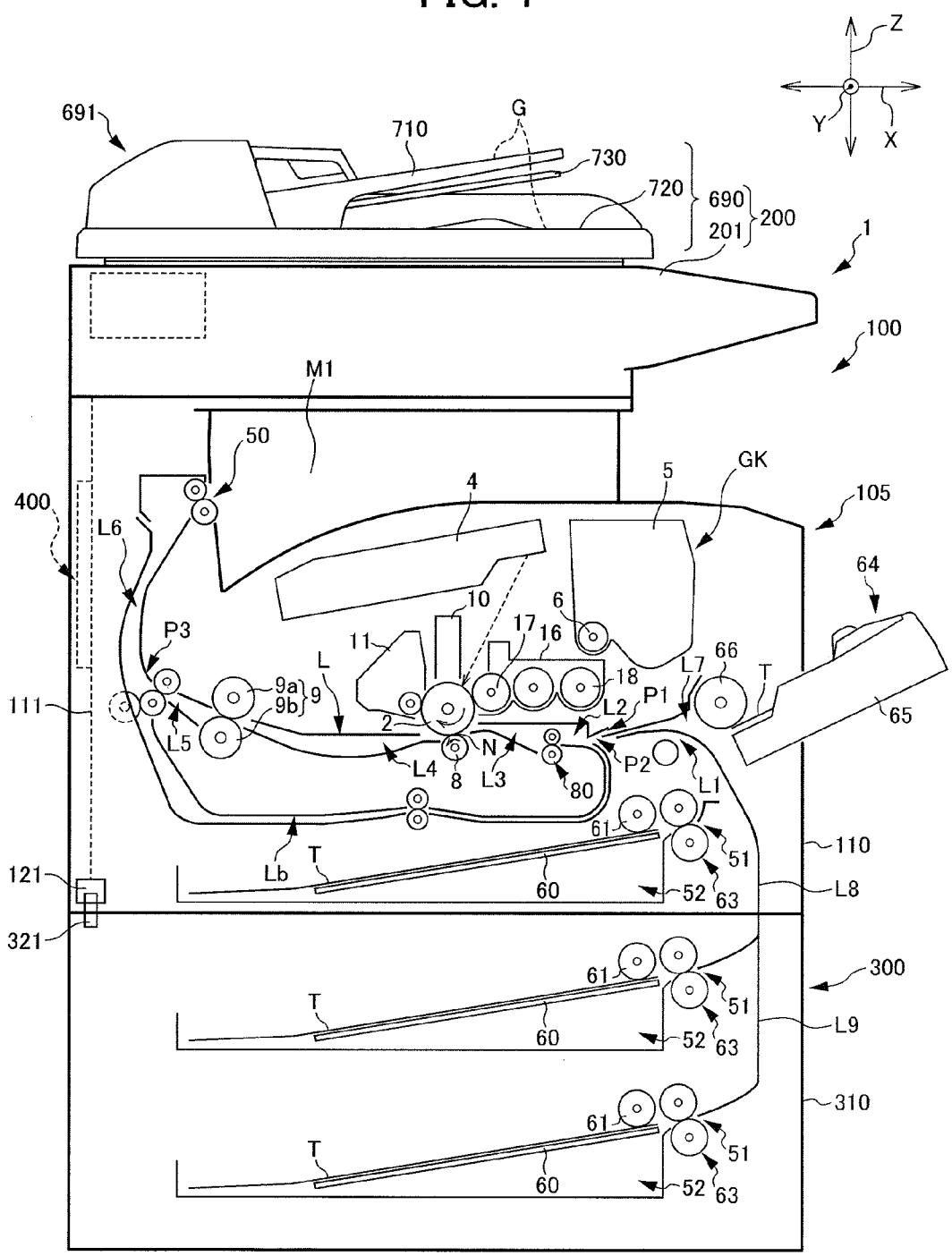
FIG. 1 is a left side figure illustrating the position of respective constituent elements in a copying machine 1 according to an embodiment of this disclosure.

The overall structure of a copying machine 1 as an embodiment of an image forming apparatus will be described with reference to FIG. 1. FIG. 1 is a left side figure illustrating the position of respective constituent elements in the copying machine 1 according to a first embodiment of this disclosure.

In the following description, when viewed by a user standing at the front side of the copying machine 1, the right-left direction is the X direction indicated by the arrow X, the longitudinal direction (depth direction) is the Y direction indicated by the arrow Y, and the vertical direction is the Z direction indicated by the arrow Z. As illustrated in FIG. 2 to FIG. 4, and FIG. 6A to FIG. 6C, the detailed description of the shielding case 400 or the like will be made with reference to the figures as viewed from the Y direction (rear side (depth side)) in FIG. 1.

As illustrated in FIG. 1, the copying machine 1 according to the present embodiment includes a copying machine main body 100 and an additional unit 300. The additional unit 300 is disposed on the lower vertical side of the copying machine main body 100, and is added onto the copying machine main body 100. The additional unit 300 is a unit that accommodates sheets T of paper, as a sheet-shaped image forming member, for supply to the housing 110 described below. The additional unit 300 is suitably added onto the copying machine main body 100 as required by a user.

As illustrated in FIG. 1, the copying machine main body 100 includes an image reading apparatus 200 and an apparatus main body 105.

The image reading apparatus 200 includes a reader unit 201 and a sheet material feeder 690. The sheet material feeder 690 is disposed on the upper vertical side of the reader unit 201 and automatically conveys an original G (sheet) to the reader unit 201.

As illustrated in FIG. 1, the sheet material feeder 690 includes a feed mechanism housing 691, an original placing portion 710, an original accumulating portion 720, and an intermediate tray 730.

The feed mechanism housing 691 is a housing for accommodating the feed mechanism in the sheet material feeder 690.

The original placing portion 710 is a unit for disposing the original G (sheet) before reading an image thereof.

The original accumulating portion 720 is located vertically below the original placing portion 710. The original accumulating portion 720 is a unit for accumulating originals G that have passed a predetermined reading position.

The intermediate tray 730 is disposed between the original placing portion 710 and the original accumulating portion 720. The intermediate tray 730 is a tray that divides the space between the original placing portion 710 and the original accumulating portion 720 into a first space on the original accumulating portion 720 side and a second space on the original placing portion 710 side.

The reader unit 201 includes: a lighting unit including a light source; a plurality of mirrors forming a light path; an imaging lens; a CCD as reading means; and a CCD board. The CCD board performs predetermined processing on image information scanned by the CCD, and outputs the image information to the apparatus main unit 105 side.

An image formed on the original G conveyed to the reading position in the sheet material feeder 690 is read by the CCD.

As illustrated in FIG. 1, the apparatus main body 105 is disposed vertically below the image reading apparatus 200 (the reader unit 201).

The apparatus main body 105 has: an image forming unit GK and a paper feeding/discharging portion. The image forming unit GK forms a image on a sheet of paper T based on predetermined image information. The paper feeding/discharging portion feeds the sheet of paper T to the image forming unit GK, and discharges the sheet of paper T on which the image has been formed.

The apparatus main body 105 includes a housing 110 and an additional unit main body 310. The housing 110 is configured as an electrically conductive member for accommodating the image forming unit GK or the paper feeding/discharging portion.

A shielding case 400 is mounted on the rear side surface 111 (left side in FIG. 1) of the housing 110 of the apparatus main body 105. The circuit board for mounting a plurality of electronic components such as a CPU, memories, a clock or the like, in addition to predetermined circuits is accommodated in the shielding case 400.

The shielding case 400 will be described below.

As illustrated in FIG. 1, the image forming unit GK includes a photosensitive drum 2, a charging unit 10, a laser scanner unit 4, a developing unit 16, a toner cartridge 5, a toner supply unit 6, a transfer roller 8, a drum cleaning unit 11, and a fixing unit 9 acting as a fixing part.

The paper feeding/discharging portion includes a paper feed cassette 52, a manual feed tray 65, a pair of registing rollers 80, and a conveyance path (L1 to L9) for the sheets T.

The photosensitive drum 2 is a cylindrical member, and functions as an image carrier. The photosensitive drum 2 is disposed on the apparatus main body 105 to be rotatable about a rotation axis that is perpendicular to the plane of FIG. 1. An electrostatic latent image is formed on the surface of the photosensitive drum 2.

The charging unit 10 is disposed vertically above (upwardly) of the photosensitive drum 2. The charging unit 10 imparts a uniform positive (positive polarity) charge to the surface of the photosensitive drum 2.

The laser scanner unit 4 is disposed vertically above (upward to) the photosensitive drum 2 so as to be spaced apart from the photosensitive drum 2. The laser scanner unit 4 is configured from a laser light source, a polygon mirror, polygon-mirror-driving motor, and the like, none of which are illustrated in the drawings.

The laser scanner unit 4 scans and exposes the surface of the photosensitive drum 2 based on image information that is output from the image reading apparatus 200. The charge imparted to the surface of the photosensitive drum 2 is removed by scanning and exposing with the laser scanner unit 4. As a result, an electrostatic latent image is formed on the surface of the photosensitive drum 2.

The laser scanner unit 4 scans and exposes the surface of the photosensitive drum 2 based on image information that is output from the image reading apparatus 200. The charge imparted to the surface of the photosensitive drum 2 is removed by scanning and exposing with the laser scanner unit 4. As a result, the electrostatic latent image is formed on the surface of the photosensitive drum 2.

The developing unit 16 is disposed in front of (right side of FIG. 1) of the photosensitive drum 2. The developing unit 16 develops a monochrome toner image (normally black) in the electrostatic latent image formed on the photosensitive drum 2. The developing unit 16 includes a developing roller 17 that can be disposed to face the photosensitive drum 2, and an, agitation roller 18 for agitating toner.

The toner cartridge 5 accommodates toner for supply to the developing unit 16.

The toner supply unit 6 supplies toner stored in the toner cartridge 5 to the developing unit 16.

The drum cleaning unit 11 is disposed behind (left side of FIG. 1) the photosensitive drum 2. The drum cleaning unit 11 removes toner and attached matter that remains on the surface of the photosensitive drum 2.

The transfer roller 8 transfers a toner image, which has been developed on the surface of the photosensitive drum 2, directly onto a sheet of paper T. A voltage application unit (not illustrated) applies a transfer bias to the transfer roller 8 for transferring the toner image developed on the photosensitive drum 2 onto the sheet of paper T.

The transfer roller 8 is configured to be movable between an abutting position to abut the photosensitive drum 2, and a separated position to be spaced apart from the photosensitive drum 2. More specifically, the transfer roller 8 is moved to the abutting position in a case in which the transfer roller 8 transfers a toner image, which has been developed on the surface of the photosensitive drum 2, onto a sheet of paper T; and the transfer roller 8 is moved to the separated position in other cases.

The sheet of paper T is interposed by the photosensitive drum 2 and the transfer roller 8 and is pressed against the surface of the photosensitive drum 2 (side on which toner image is developed). In this manner, a transfer nip N that acts as a transfer unit is formed. The toner image developed on the photosensitive drum 2 is transferred to the sheet of paper T.

The fixing unit 9 melts the toner that forms the toner image transferred onto the sheet of paper T and fixes the image to the sheet of paper T. The fixing unit 9 includes a heating roller 9a that is heated by a heater, and a pressing roller 9b that is pressed against the heating roller 9a. The sheet of paper T on which the toner image has been transferred is interposed between and conveyed by the heating roller 9a and the pressing roller 9b. As a result of the sheet of paper T being interposed and conveyed between the heating roller 9a and the pressing roller 9b, the toner transferred onto the sheet of paper T is melted and fixed on the surface of the sheet of paper T.

The paper feed cassette 52 is disposed in a bottom portion (vertically underneath) of the apparatus main body 105. The paper cassette 52 is configured to be horizontally withdrawable to a front side (the right side of FIG. 1) of the apparatus main unit 105. The paper feed cassette 52 includes a placing board 60 on which sheets T are placed. The paper feed cassette 52 stores the sheets T in a configuration in which the sheets T are placed on the placing board 60. A cassette paper feed unit 51 is disposed at an end portion on a paper feeding side in the paper cassette 52 (an end portion on the right in FIG. 1). The cassette paper feed unit 51 feeds sheets T stored in the paper feed cassette 52 to the conveyance path L.

The cassette paper feed unit 51 includes a double feed preventing mechanism that includes a forward feed roller 61 and a pair of rollers 63. The forward feed roller 61 is a roller that picks up a sheet of paper T that is placed on the placing board 60. The roller pair 63 is a roller pair for feeding sheets of paper T one by one to the conveyance path L.

The conveyance path L for conveying the sheet of paper T is formed between the cassette paper feed unit 51 and a manual paper feed unit 64 and a paper discharging unit 50. The conveyance path L includes a first conveyance path L1, a second conveyance path L2, a third conveyance path L3, a fourth conveyance path L4, a fifth conveyance path L5, and a sixth conveyance path L6. The first conveyance path L1 is a conveyance path from the cassette paper feed unit 51 of the apparatus main body 105 to the first joining portion P1. The second conveyance path L2 is a conveyance path from the first joining portion P1 to the pair of registing rollers 80. The third conveyance path L3 is a conveyance path from the pair of registing rollers 80 to the transfer roller 8. The fourth conveyance path L4 is a conveyance path from the pair of registing rollers 8 to the fixing unit 9. The fifth conveyance path L5 is a conveyance path from the fixing unit 9 to the branching portion P3. The sixth conveyance path L6 is a conveyance path from the branching portion P3 to the paper discharging unit 50.

The conveyance path L includes a seventh conveyance path L7 from the manual feed tray 65 to the first joining portion P1. The first joining portion P1 is a joining portion between the first conveyance path L1 and the seventh conveyance path L7. The first conveyance path L1 is a conveyance path that conveys the sheet of paper T from the cassette paper feed unit 51 of the apparatus main body 105. The seventh conveyance path L7 is a conveyance path for conveying the sheet of paper T from the manual feed tray 65.

The conveyance path L according to the present embodiment is formed by extending from the first conveyance path L1 to the additional unit 300 side. The first conveyance path L1 is a conveyance path from the cassette paper feed unit 51 of the apparatus main body 105 to the first joining portion P1. The conveyance path L according to the present embodiment has a additional unit conveyance path L8. The additional unit conveyance path L8 is a conveyance path for conveying the sheet of paper T fed from the additional unit 300 to the first conveyance path L1.

The additional unit 300 includes paper cassettes 52, 52 arranged in a vertical configuration (so as to be two-tiered). The additional unit 300 includes cassette paper feed units 51, 51 that are disposed corresponding to the paper cassettes 52, 52. The additional unit 300 is connected with the housing 110 through a connection mechanism (not illustrated).

The additional unit 300 that is connected with the housing 110 includes an additional unit side connector 321. The additional unit side connector 321 receives a control signal from an image forming control unit (not illustrated) or power supplied from a power source (not illustrated) on the housing 110 side through the apparatus main body side connector 121.

The additional unit 300 includes a liaison conveyance path L9. The liaison conveyance path L9 is a conveyance path for conveying the sheet of paper T, that is fed from the cassette paper feed units 51, 51, to the additional unit conveyance path L8 on the apparatus main body 105 side.

A second joining portion P2 is disposed along the second conveyance path L2. Furthermore, the conveyance path L includes a returning conveyance path Lb from the branching portion P3 to the second joining portion P2. The second joining portion P2 is where the second conveyance path L2 joins the returning conveyance path Lb.

The pair of registing rollers 80 is disposed upstream (the right side of FIG. 1) in a direction of conveying the sheet of paper T on the transfer roller 8. The pair of registing rollers 80 is a pair of rollers for correcting skew (diagonal paper feed) of the sheet of paper T, and for adjusting timing with respect to the formation of a toner image.

The returning conveyance path Lb is a conveyance path provided for the purpose of causing another surface (unprinted surface) opposite to a surface that has already been printed to face the photosensitive drum 2 when duplex printing is performed on the sheet of paper T.

By way of the returning conveyance path Lb, the sheet of paper T, which has been conveyed from the branching portion P3 to the paper discharging unit 50 side, can be reversed and returned to the second conveyance path L2. A toner image formed on the photosensitive drum 2 is transferred onto an unprinted surface of the sheet of paper T that has been reversed through the returning conveyance path Lb.

The manual paper feed unit 64 is provided on a front face side of the cabinet main body 110 (right side in FIG. 1) and above the paper cassette 52. The manual paper feed unit 64 includes a manual feed tray 65 and a paper feed roller 66. A base end portion of the manual feed tray 65 is attached pivotably (openably and closably) to the vicinity of an entry to the seventh conveyance path L7. The manual feed tray 65 composes a portion of the front surface of the housing 110 when in the closed configuration. The paper feed roller 66 picks up a sheet of paper T placed on the manual feed tray 65, and feeds the sheet of paper T to the seventh conveyance path L7.

The manual paper feed unit 64 feeds the sheets of paper T placed on the manual feed tray 65 in the opened state to the second conveyance path L2 through the seventh conveyance path L7 and the first joining portion P1.

The paper discharging unit 50 is formed at the end portion in the sixth conveyance path L6. The paper discharging unit 50 is disposed at the upper portion of the apparatus main body 105. The paper discharging unit 50 is opened towards the front side of the apparatus main body 105 (right side of FIG. 1). The paper discharging unit 50 discharges the sheet of paper T with the toner fixed thereto by the fixing unit 9 to the outside of the apparatus main unit 105.

A discharged paper accumulating portion M1 is formed on an opening side of the paper discharging unit 50. The discharged paper accumulating portion M1 is formed on a top face (outer face) of the apparatus main body 105. The discharged paper accumulating portion M1 is where the top surface of the apparatus main unit 105 is formed to be recessed downwardly (vertically downward). A bottom surface of the discharged paper accumulating portion M1 composes a part of the top surface of the apparatus main unit 105. The sheet of paper T, which has been discharged from the paper discharging unit 50, is stacked and accumulated on the discharged paper collecting section M1. The predetermined image is transferred to the sheet of paper T that is discharged from the paper discharging unit 50.

Next, the configuration of the shielding case 400 that is the characteristic portion in the copying machine 1 according to the embodiment will be described making reference to FIG. 2 to FIG. 5.

Figure 2:
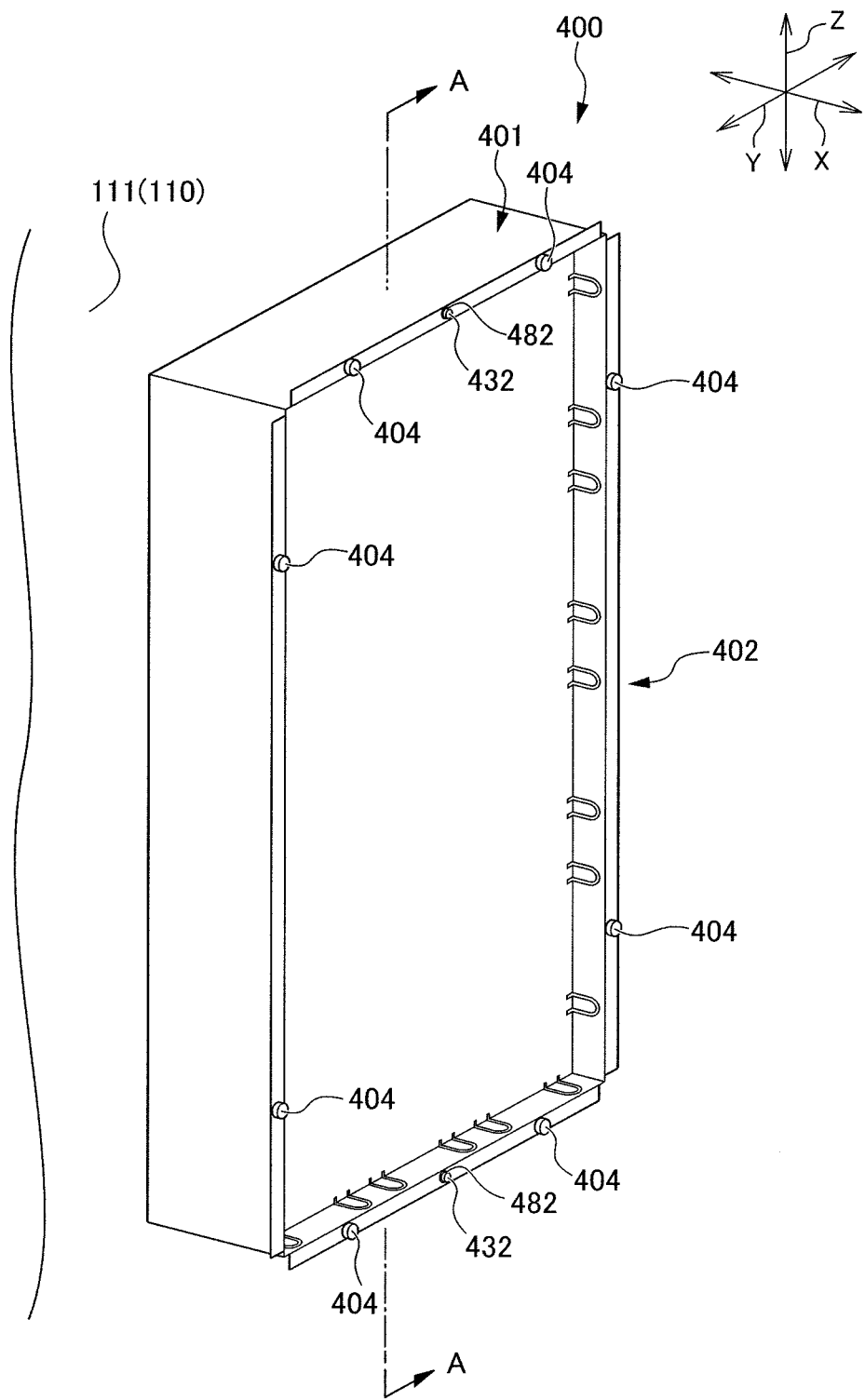
FIG. 2 is a perspective figure of a state in which a shielding case 400 is fitted to a rear side surface 111 of a housing 110 of the copying machine 1 according to the present embodiment.
Figure 3:
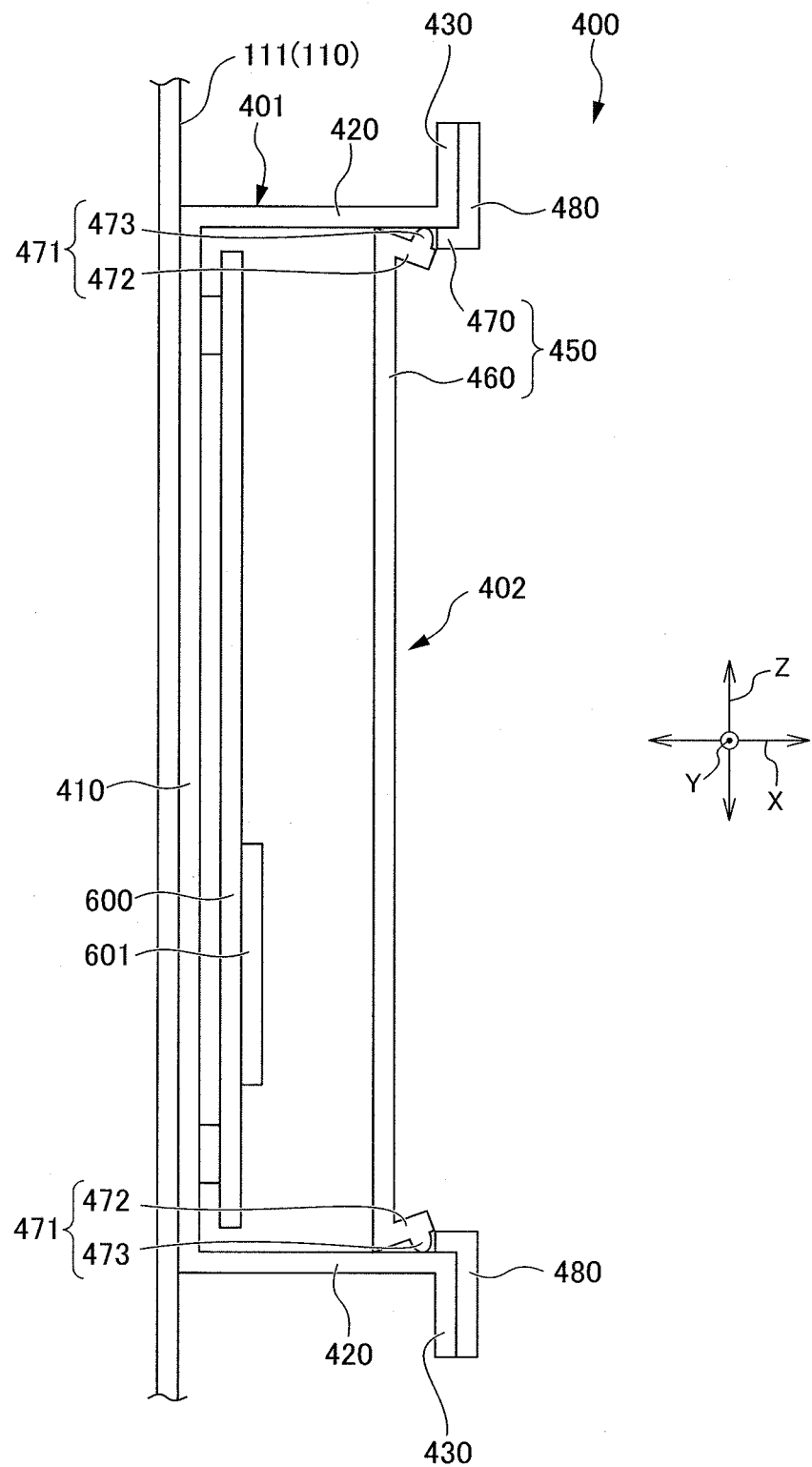
FIG. 3 is a sectional view along the line A-A in FIG. 2.
Figure 4:
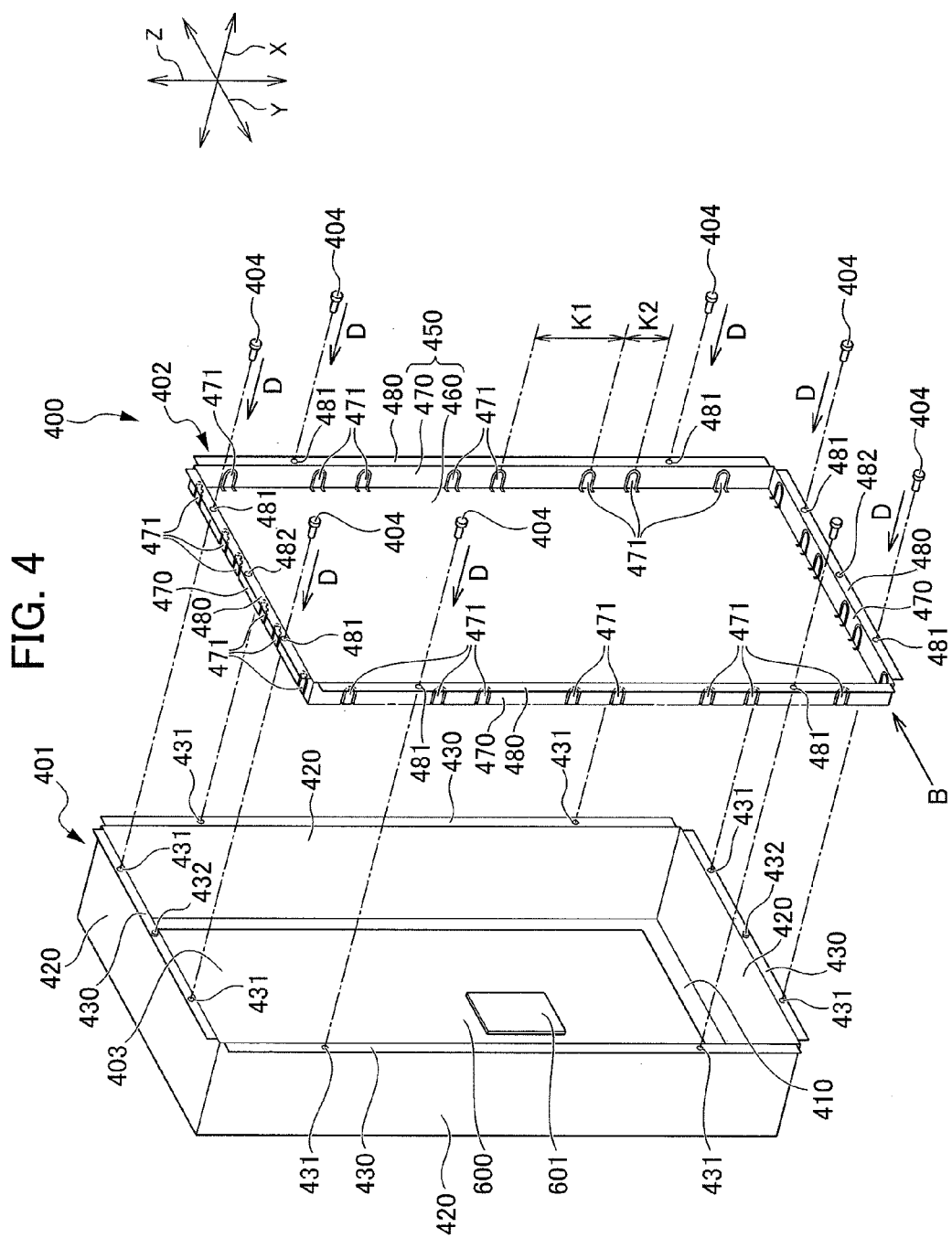
FIG. 4 is a perspective figure of a state in which a lid 402 is removed from a cabinet main body 401 in the shielding case 400 according to the present embodiment.
Figure 5:
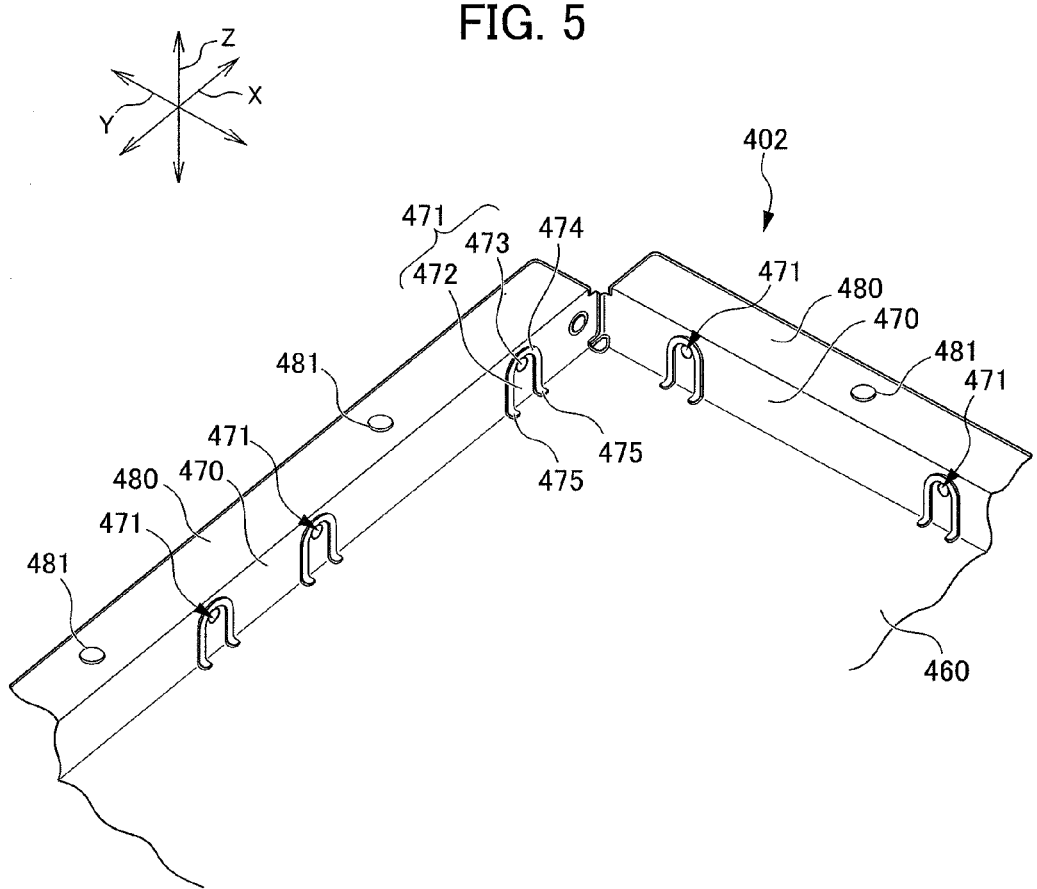
FIG. 5 is a perspective view seen from the point B in FIG. 4.

FIG. 2 is a perspective figure of a state in which a shielding case 400 is fitted to the rear side surface 111 of the housing 110 of the copying machine 1 according to the present embodiment. FIG. 3 is a sectional view along the line A-A in FIG. 2. FIG. 4 is a perspective figure of a state in which a lid 402 is removed from cabinet main body 401 in a shielding case 400 according to the present embodiment. FIG. 5 is a perspective view seen from the point B in FIG. 4.

As illustrated in FIG. 2 and FIG. 3, the shielding case 400 is mounted on the rear side surface 111 of the housing 110 of the copying machine 1. The shielding case 400 includes a cabinet main body 401, a lid 402, and a plurality of fixing threaded members 404 acting as a fixing member. The cabinet main body 401 and the lid 402 are formed from a member that exhibits electrically conductive properties.

As illustrated in FIG. 4, the cabinet main body 401 has an opening 403. The cabinet main body 401 is substantially formed into the shape of a solid rectangle with a base. The cabinet main body 401 accommodates the circuit board (board) 600 for mounting of electronic components 601.

As illustrated in FIG. 3 and FIG. 4, the cabinet main body 401 includes a main body bottom surface portion 410, a main body side wall 420 connected to the main body bottom surface portion 410, and a main body outer edge portion 430. The cabinet main body 401 is formed by processing of a metal plate or the like.

The main body bottom surface portion 410 is fitted to the rear side surface 111 of the housing 110. The main body bottom surface portion 410 is formed from a square tabular member. The main body bottom surface portion 410 is electrically connected with the housing 110.

The circuit board 600 is fitted to the surface opposite to the rear side surface 111 side of the housing 110 in the main body bottom surface portion 410. The circuit board 600 is electrically connected main body bottom surface portion 410 of the cabinet main body 401.

One or a plurality of electronic components 601 is mounted on the circuit board 600. The one or a plurality of electronic components 601 includes for example electronic components or circuits constituting a cause of radiation of high frequency noise such as ASIC or the like.

The main body side wall 420 is formed to extend (project) in an orthogonal configuration relative to the main body bottom surface portion 410 from each side of the outer edge of the main body bottom surface portion 410. The main body side wall 420 is formed as a square-shaped tube along the periphery of the outer edge side of the main body bottom surface portion 410.

One portion on the end side that is opposite to the main body bottom surface portion 410 in the main body side wall 420 is formed as an opening 403. The opening 403 opens towards the outer side of the copying machine 1.

The main body side wall 420 in the present embodiment is formed for example by bending a metal plate or the like in the form of a square-shaped tube along the outer edge of the main body bottom surface portion 410. A connecting portion other than the portion that is bent in the main body side wall 420 for example is bonded by a welding process, a burring process or the like.

The main body outer edge portion 430 is formed continuous with the end portion on the opening 403 side in the main body side wall 420. The main body outer edge portion 430 is extended with a predetermined width on the outer side of the opening 403 in a direction orthogonal to the main body side wall 420 from each side of the end portion on the opening 403 side in the main body side wall 420. The main body outer edge portion 430 is formed by a plate member parallel to the main body bottom surface portion 410.

In each side of the end portion on the opening 403 side in the main body side wall 420, the main body outer edge portion 430 is formed with a predetermined width to extend across the whole area on each side.

The main body outer edge portion 430 includes a plurality of main body side threaded holes 431 and a plurality of main body side engaging projection 432 as a locating portion.

The plurality of main body side threaded holes 431 is formed as holes that pierce the main body outer edge portion 430 in the X direction. In the present embodiment, eight main body side threaded holes 431 are provided in pairs on each main body outer edge portion 430.

The plurality of respective main body side threaded holes 431 is fixed respectively with a plurality of lid side threaded holes 481 described below by fixing threaded members 404 described below. In this manner, the cabinet main body 401 and the lid 402 are fixed.

The plurality of main body side engaging projections 432 is formed on the main body outer edge portion 430.

The plurality of main body side engaging projections 432 is formed to project from the main body outer edge portion 430 to the side that is opposite to the main body bottom surface portion 410. In the present embodiment, the plurality of main body side engaging projections 432 is provided as two projections respectively in the approximate center in the Y direction on the two main body outer edge portions 430, 430 that are spaced apart in the Z direction.

The plurality of main body side engaging projections 432 engages with the lid side engaging hole 482 that acts as a located portion as described below.

The lid 402 is disposed to cover the opening 403 of the cabinet main body 401. The lid 402 includes an opposed outer edge portion 480 and a recessed portion 450.

The opposed outer edge portions 480 is formed from a parallel plate member on the main body outer edge portion 430. The opposed outer edge portions 480 are opposed to the main body outer edge portion 430. The opposed outer edge portions 480 are formed in substantially the same shape as the main body outer edge portion 430 to thereby correspond to the main body outer edge portions 430 when viewed from the X direction. The opposed outer edge portions 480 are disposed in an overlapping configuration in the X direction with the main body outer edge portion 430. The opposed outer edge portions 480 are disposed in abutment with or proximity to the main body outer edge portion 430.

The opposed outer edge portions 480 include a plurality of lid side threaded holes 481 and a plurality of lid side engaging holes 482 acting as a located portion.

The plurality of lid side threaded holes 481 is formed by holes piercing the opposed outer edge portions 480 in the X direction. The plurality of lid side threaded holes 481 is disposed at a position that overlaps in the X direction with the plurality of main body side threaded holes 431 to thereby correspond with the main body side threaded holes 431 described above. In the present embodiment, eight lid side threaded holes 481 are provided in pairs on each opposed outer edge portion 480 corresponding to the plurality of main body side threaded holes 431.

The plurality of respective lid side threaded holes 481 is fixed by fixing threaded members 404 described below respectively to the plurality of main body side threaded holes 431 described above. In this manner, the cabinet main body 401 and the lid 402 are fixed.

The plurality of lid side engaging holes 482 is formed on the opposed outer edge portions 480.

The plurality of lid side engaging holes 482 is formed by holes piercing the opposed outer edge portions 480 in the X direction. The plurality of lid side engaging holes 482 is engaged to the main body side engaging projections 432 to regulate the location of the lid 402 in the direction of extension of the main body outer edge portion 430. In the present embodiment, the direction of extension of the main body outer edge portion 430 is the Y-Z plane direction that is formed in the Y direction and the Z direction.

The plurality of lid side engaging holes 482 is formed at a position that overlaps in the X direction with the plurality of main body side engaging projections 432 to thereby correspond to the plurality of main body side engaging projections 432 described above. The plurality of lid side engaging holes 482 is provided as two holes respectively in the approximate center in the Y direction on the two opposed outer edge portions 480 that are spaced apart in the Z direction to thereby correspond to the plurality of main body side engaging projections 432 described above.

The recessed portion 450 is formed continuously with the inner edge of the opposed outer edge portions 480. The recessed portion 450 is formed with a recess oriented from the opposed outer edge portion 480 to the main body bottom surface portion 410 side of the cabinet main body 401.

The recessed portion 450 is formed integrally by a lid bottom portion 460 and an opposed side wall portion 470.

The lid bottom portion 460 is formed by a square plate member. The lid bottom portion 460 is disposed in parallel with the main body bottom surface portion 410. The lid bottom portion 460 is formed in approximately the same shape as the main body bottom surface portion 410 when viewed from the X direction. The lid bottom portion 460 separated by a predetermined distance from the circuit board 600. The outer edge of the lid bottom portion 460 is connected to the end on the opposed side wall portion 470 on the opposite side to the opposed outer edge portion 480.

The opposed side wall portion 470 is connected with the inner edge of the opposed outer edge portions 480. The opposed side wall portion 470 is opposed to the main body side wall 420. The opposed side wall portion 470 is formed along the inner surface of the main body side wall 420 on a portion on the end side on the opening 403 side in the main body side wall 420. The opposed side wall portion 470 is disposed to overlap in the Y direction or the Z direction with a portion on the end side on the opening side in the main body side wall 420.

The opposed side wall portion 470 includes a plurality of contact points 471.

The plurality of contact points 471 is formed on the opposed side wall portion 470. The plurality of contact points 471 is biased toward the main body side wall 420 and is electrically connected with the cabinet main body 401 and the lid 402.

The interval between the plurality of contact points 471 is set in response to the frequency of the regulated noise.

More specifically, for example, the interval between the plurality of contact points 471 is set so that the noise frequencies that occur when noise leaks from the slight grooves in the interval of the plurality of contact points 471 do not coincide with a frequency that is regulated by EMI regulation (for example, 30 MHz-6 GHz). For example, when the interval between the plurality of contact points 471 is fixed, there is the possibility of a function as a dipole antenna. Consequently, the setting of the interval between the plurality of contact points 471 is not fixed.

In the present embodiment, for example, the interval between a predetermined contact point 471 and an adjacent contact point 471 is not fixed and is set to repeat a first interval K1 and a second interval K2. The first interval K1 is an interval that is different from the second interval K2 and is larger than the second interval K2. In the present embodiment, for example, the first interval K1 is of the order of 35 mm to 50 mm, and the second interval K2 is of the order of 25 mm to 30 mm.

The respective contact points 471 include a biasing portion 472 and a projection 473 as illustrated in FIG. 5. The biasing portion 472 is formed as a notch in the lid bottom portion 460 and the opposed side wall portion 470. The biasing portion 472 is formed by a U-shaped groove 474 and an extending groove 475.

The U-shaped groove 474 is a notched groove that pierces the opposed side wall portion 470. The U-shaped groove 474 is a groove formed in the shape of a letter U. The end on the open side of the letter U in the U shape of the U-shaped groove 474 is positioned at the end on the lid bottom portion 460 side in the opposed side wall portion 470.

The extending groove 475 is a notched groove that pierces the lid bottom portion 460. The extending groove 475 is an extended groove that extends toward the lid bottom portion 460 from the end on the open side of the letter U of the U-shaped groove 474.

The biasing portion 472 is formed by a portion on the inner side of the extended groove 475 and the U-shaped groove 474. The biasing portion 472 is formed in a cantilever configuration. The cantilevered shape of the biasing portion 472 has a free end. The free end of the biasing portion 472 is formed by a notched portion from the U-shaped groove 474. The free end of the biasing portion 472 is disposed near the opposed outer edge portion 480 in the opposed side wall portion 470.

Although detailed description will be provided below, the free end side of the biasing portion 472 is in a flexed state due to pressure from the projection 473 described below, and undergoes elastic deformation and exhibits an elastic force.

In the present embodiment, the degree of flexure of the elastic deformation of the biasing portion 472 can be adjusted by adjusting the length of the extended groove 475. For example, when the length of the extended groove 475 is shortened, the rigidity of the elastic deformation of the biasing portion 472 increases. Conversely, when the length of the extended groove 475 is lengthened, the rigidity of the elastic deformation of the biasing portion 472 is reduced.

The degree of flexure of the elastic deformation of the biasing portion 472 is suitably adjusted by adjusting the length of the extended groove 475 by taking into account the biasing force or the like of the biasing portion 472 or the material or thickness of the shielding case 400.

In the present embodiment, although a configuration has been described in which the extended groove 475 is formed in the lid bottom portion 460 in the biasing portion 472, there is no limitation in this regard, and a configuration is possible in which the extended groove 475 is omitted.

As illustrated in FIG. 3 and FIG. 5, the projection 473 is formed on the distal end side on the side with the free end of the biasing portion 472. The projection 473 is formed on the surface on the main body side all portion 420 side (surface facing outer side of shielding case 400) in the biasing portion 472.

The projection 473 projects from the surface on the main body side wall 420 side in the biasing portion 472 towards the main body side wall 420 side.

In the plurality of contact points 471 that have the above configuration, as illustrated in FIG. 3, a plurality of biasing portions 472 is configured to flex towards the side opposite to the main body side wall 420 and exhibit an elastic force in a state in which the lid 402 is attached to the cabinet main body 401. The plurality of projections 473 abuts with the main body side wall 420 in a biased state by the plurality of biasing portions 472 toward the main body side wall 420. In this manner, the plurality of contact points 471 is connected electrically with the cabinet main body 401 and the lid 402.

The plurality of fixing threaded members 404 are members for fixing the lid 402 to the cabinet main body 401 in a state in which the lid 402 is mounted on the cabinet main body 401. As illustrated in FIG. 4, the plurality of fixing threaded members 404 is moved in the screw fitting direction D that is the direction of fitting the plurality of fixing threaded members 404 to fix the lid 402 and the cabinet main body 401. The plurality of contact points 471 is biased toward a direction that is intersected with the fitting direction D to thereby electrically connect the cabinet main body 401 and the lid 402.

Next, the sequence of fitting the lid 402 to the cabinet main body 401 in the shielding case 400 according to the present embodiment will be described making reference to FIG. 6A to FIG. 6D.

Figure 6A:
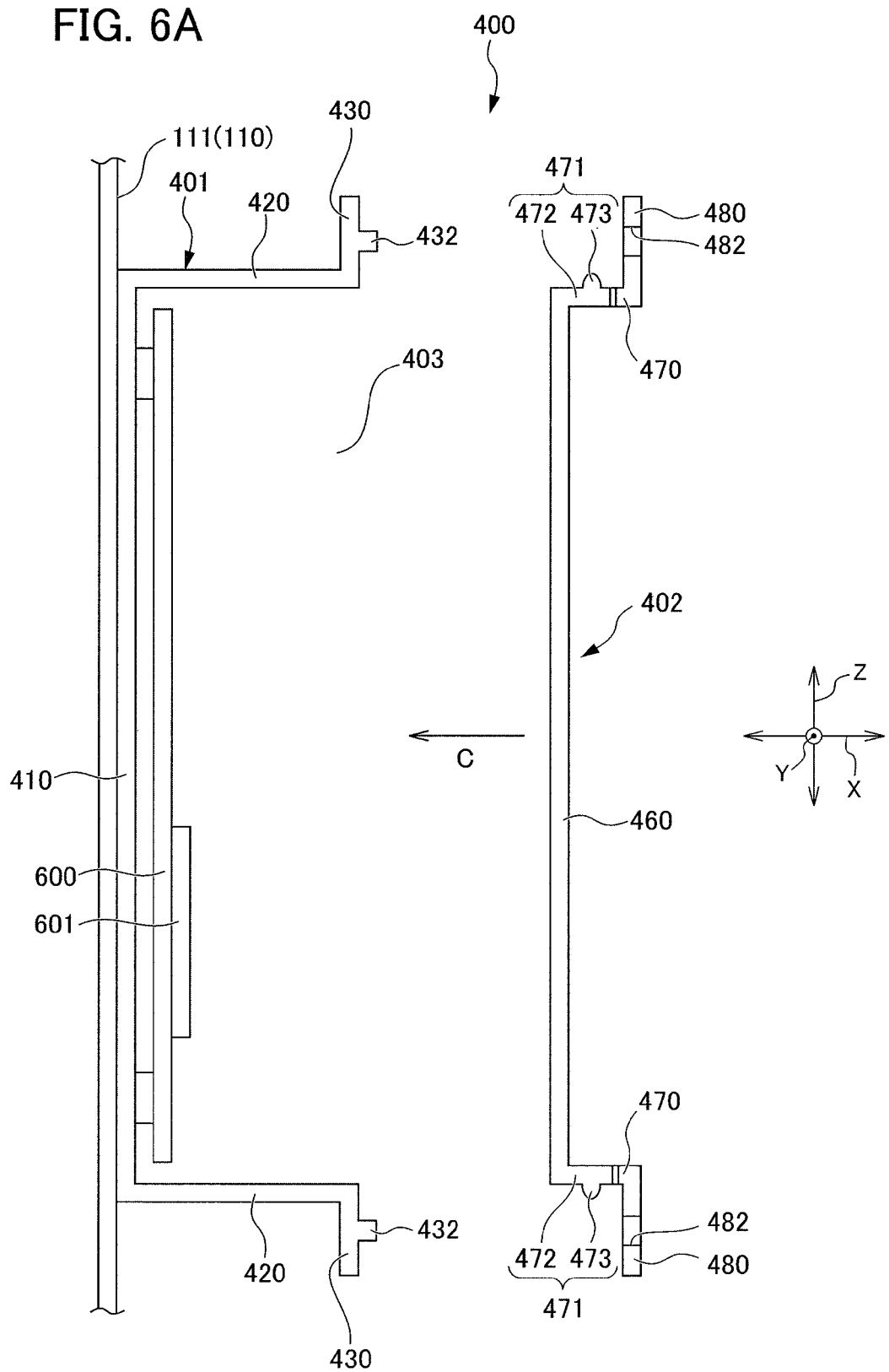
FIG. 6A is schematic view of the sequence of fitting the lid 402 to the cabinet main body 401, and illustrates a state in which the lid 402 is removed from the cabinet main body 401.
Figure 6B:
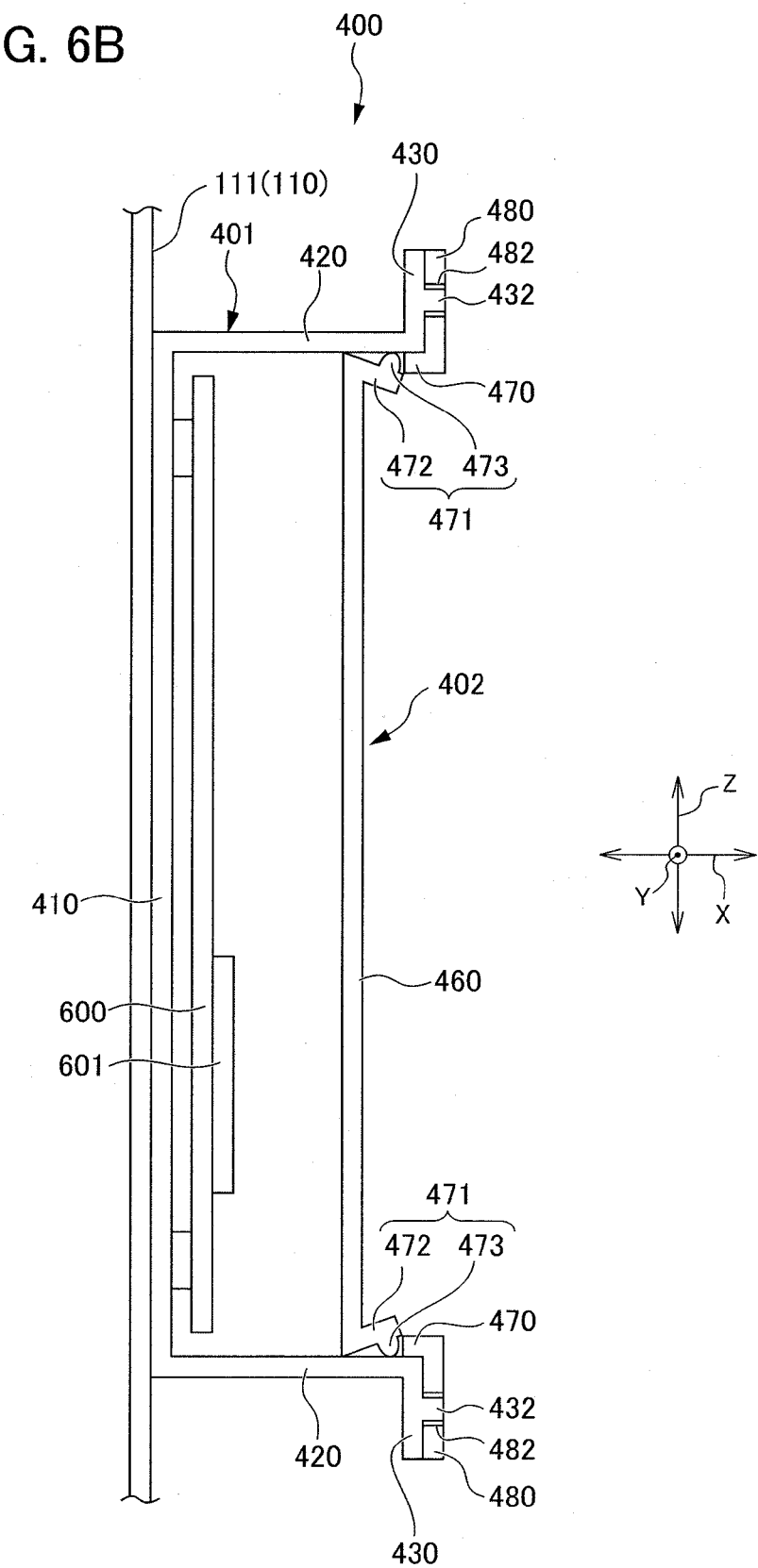
FIG. 6B is schematic view of the sequence of fitting the lid 402 to the cabinet main body 401, and illustrates a state in which the lid 402 is fitted to the cabinet main body 401.
Figure 6C:
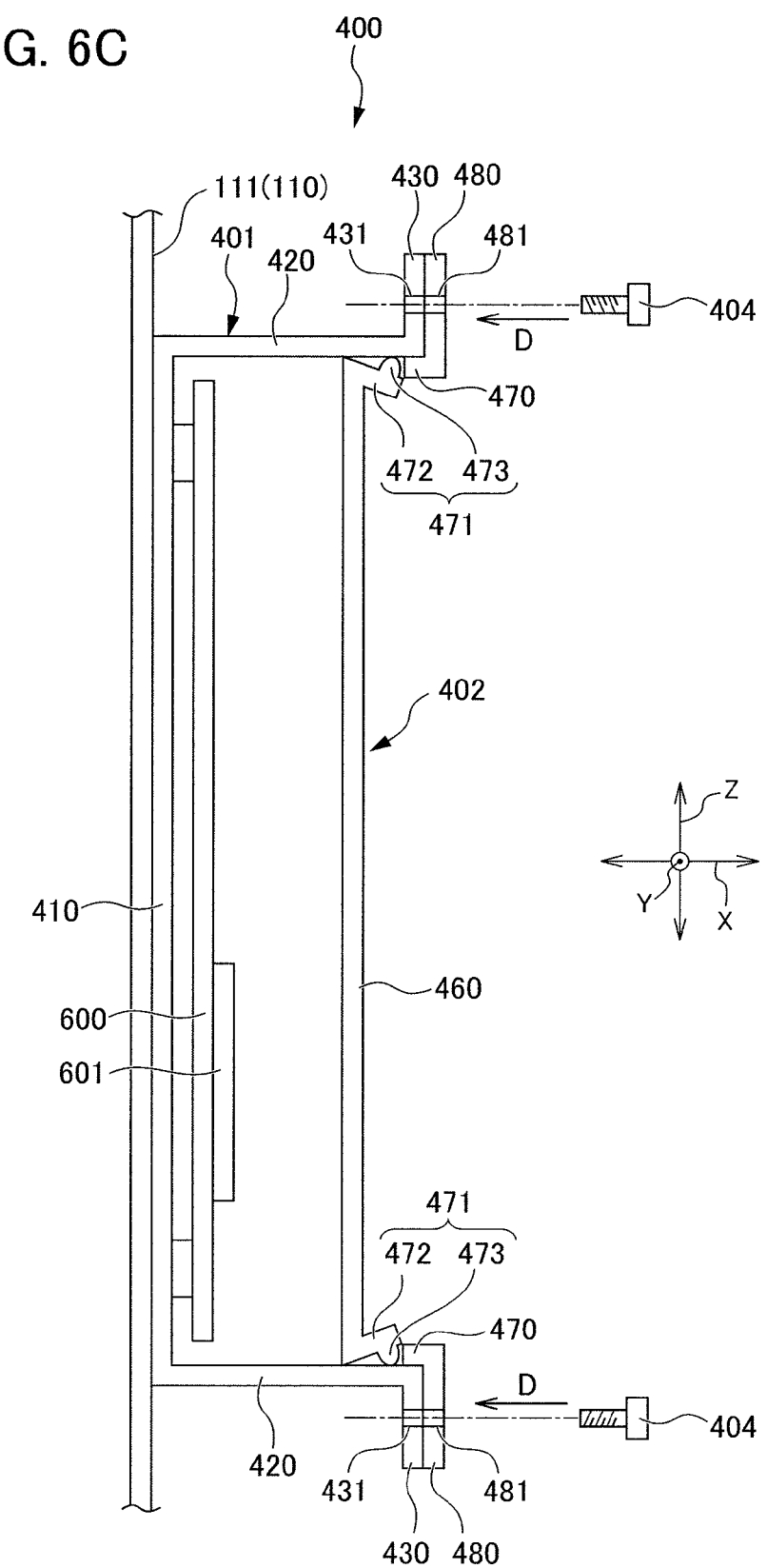
FIG. 6C is schematic view of the sequence of fitting the lid 402 to the cabinet main body 401, and illustrates a state prior to fixing with a plurality of fixing threaded members 404.
Figure 6D:
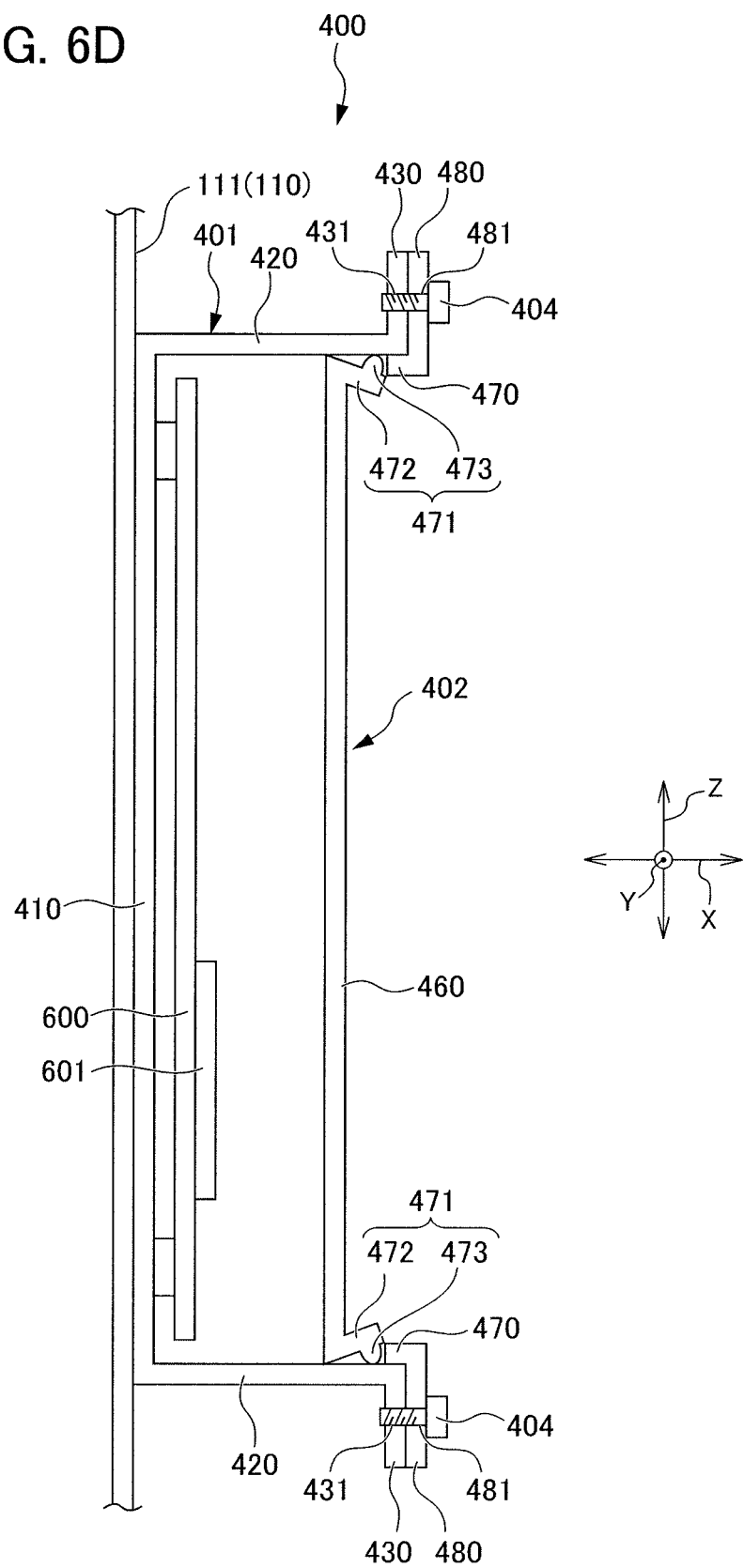
FIG. 6D is schematic view of the sequence of fitting the lid 402 to the cabinet main body 401, and illustrates a state in which the cabinet main body 401 and the lid 402 are fixed with a plurality of fixing threaded members 404.

FIG. 6A is schematic view of the sequence of fitting the lid 402 to the cabinet main body 401, and illustrates a state in which the lid 402 is removed from the cabinet main body 401. FIG. 6B is schematic view of the sequence of fitting the lid 402 to the cabinet main body 401, and illustrates a state in which the lid 402 is fitted to the cabinet main body 401. FIG. 6C is schematic view of the sequence of fitting the lid 402 to the cabinet main body 401, and illustrates a state prior to fixing with a plurality of fixing threaded members 404. FIG. 6D is schematic view of the sequence of fitting the lid 402 to the cabinet main body 401, and illustrates a state in which the cabinet main body 401 and the lid 402 are fixed with a plurality of fixing threaded members 404.

FIG. 6A and FIG. 6B are schematic figures seen from the Y direction, and for the purposes of convenience of description, illustrate the plurality of contact points 471 and the lid side engaging holes 482 and main body side engaging projections 432 on the same plane. FIG. 6C and FIG. 6D are schematic figures seen from the Y direction, and for the purposes of convenience of description, illustrate the plurality of contact points 471 and the main body side threaded holes 431, the lid side threaded holes 481 and the fixing threaded members 404 on the same plane.

As illustrated in FIG. 6A to FIG. 6D, the sequence of fitting the lid 402 to the cabinet main body 401 in a state in which the circuit board 600 is accommodated in the cabinet main body 401 will described. The cabinet main body 401 is fitted to the rear side surface 111 of the housing 110 of the copying machine 1.

Firstly, as illustrated in FIG. 6A, the lid 402 is moved in the lid fitting direction C relative to the cabinet main body 401 that accommodates the circuit board 600 that mounts the electronic components 601. The lid fitting direction C is a direction that is intersected with the direction in which the plurality of contact points 471 is biased.

The lid 402 is inserted from the opening 403 side of the cabinet main body 401 is located by moving the lid 402 in the lid fitting direction C. In this manner, the plurality of projections 473 of the plurality of contact points 471 of the lid 402 abuts with the inner edge of the main body outer edge portion 430. The end on the opening 403 side of the main body side wall 420 is connected to the inner edge of the main body outer edge portion 430.

Furthermore, the plurality of the biasing portions 472 is flexed by of the plurality of projections 473 by moving the lid 402 in the lid fitting direction C. Therefore, the plurality of projections 473 is pressed onto the inner edge of the main body outer edge portion 430 (the end near the opening 403 of the main body side wall 420) and moves toward the inner portion of the lid 402 (the side that is separated from the main body side wall 420).

In this manner, the lid 402 is further moved in the lid fitting direction C. In this manner, the plurality of projections 473 is moved along the inner surface of the main body side wall 420 in abutment with the main body side wall 420 by as a result of biasing by the plurality of biasing portions 472.

Consequently, the lid 402 is further moved in the lid fitting direction C. The lid 402 is moved to overlap with a state in which the opposed outer edge portion 480 abuts with or is in proximity to the main body outer edge portion 430.

As illustrated in FIG. 6B, the plurality of biasing portions 472 is configured to flex towards the side opposite to the main body side wall 420 and exhibits an elastic force in a state in which the lid 402 is fitted to the cabinet main body 401. The plurality of projections 473 abuts with a stable pressing force with the main body side wall 420 due to biasing onto the main body side wall 420 with the plurality of biasing portions 472.

As a result, the lid 402 is fitted to the cabinet main body 401 in a state in which a deviation in the pressing force onto the main body side wall 420 in the plurality of contact points 471 is reduced.

Furthermore, when the lid 402 is fitted to the cabinet main body 401, at the same time, as illustrated in FIG. 6B, the main body side engaging projection 432 is inserted into the lid side engaging hole 482. In this manner, the lid side engaging hole 482 is engaged with the main body side engaging projection 432. Therefore the position (movement) in the Y-Z plane of the lid 402 is regulated. The lid 402 is fitted to the cabinet main body 401 in a state in which the plurality of contact points 471 is biased with a fixed pressing force onto the main body side wall 420, and the position (movement) in the Y-Z plane is regulated.

Next, the lid 402 is fixed to the cabinet main body 401.

More specifically, in a state in which the lid 402 is fitted to the cabinet main body 401, as illustrated in FIG. 6C, the fixing threaded members 404 are inserted in the threaded fitting direction D from the outer side of the lid 402. Then the fixing threaded members 404 are threadably engaged with the lid side threaded hole 481 and the main body side threaded hole 431. The cabinet main body 401 and the lid 402 are fixed with the fixing threaded members 404. The threaded fitting direction D is the direction that is intersected with the direction in which the plurality of contact points 471 is biased. In the present embodiment, the threaded fitting direction D corresponds with the lid fitting direction C.

In this context, the threaded fitting direction D when fitting the fixing threaded members 404 is a direction that is different from the direction of biasing of the plurality of contact points 471. Therefore, the fixing threaded members 404 do not interfere with the biasing force of the plurality of contact points 471, and the lid 402 can be fixed to the cabinet main body 401 in a state in which the plurality of contact points 471 are biased onto the main body side wall 420. Consequently, operational characteristics are superior in relation to fixing of the cabinet main body 401 and the lid 402 with the fixing threaded members 404.

Next the shielding action in relation to high frequency noise radiated from the electronic components 601 mounted on the circuit board 600 in the copying machine 1 that includes the shielding case 400 will be described.

High frequency noise is radiated from the electronic components 601 accommodated in the shielding case 400 according to the present embodiment.

The main body bottom surface portion 410 of the cabinet main body 401 is electrically connected with the housing 110 of the copying machine 1 on the side with the main body bottom surface portion 410 of the cabinet main body 401. Consequently, high frequency noise from the electronic components 601 that is radiated toward the main body bottom surface portion 410 of the cabinet main body 401 flows into the ground through the housing 110. In this manner, the shielding case 400 according to the present embodiment is imparted with shield characteristics in relation to the main body bottom surface portion 410 side in the cabinet main body 401.

On the other hand, on the lid 402 side, the plurality of contact points 471 abut with a stable pressing force on the main body side wall 420 of the cabinet main body 401. As a result, the plurality of contact points 471 is electrically connected with the cabinet main body 401 and the lid 402 in a stable configuration.

Therefore, the high frequency noise from the electronic components 601 that is radiated towards the lid 402 flows into the ground through the housing 110 and the cabinet main body 401. Consequently, the shielding case 400 according to the present embodiment can be configured with stable shield configuration on the lid 402 side.

The plurality of projections 473 abut with the main body side wall 420 in a state of being biased onto the main body side wall 420 by the plurality of biasing portions 472. As a result, the lid 402 is fitted to the cabinet main body 401 in a state in which a deviation in the pressing force onto the main body side wall 420 in the plurality of contact points 471 is reduced. Therefore, a deviation in the pressing force of the plurality of contact points 471 during fitting can be reduced. In this manner, a deviation in the shield property can be reduced.

The position (movement) of the lid 402 in the Y-Z plane is regulated by engaging the lid side engaging hole 482 with the main body side engaging projection 432. The lid 402 is fitted to the cabinet main body 401 in a state in which the plurality of contact points 471 is biased with a fixed pressing force onto the main body side wall 420 and the position (movement) in the Y-Z plane is regulated.

In this manner, the plurality of contact points 471 is placed in contact in a stable configuration with the main body side wall 420 in a state in which a bias in the pressing force of the plurality of contact points 471 is reduced in relation to the Y-Z plane direction.

Furthermore, the bias in the pressing force of the plurality of contact points 471 can be reduced. Consequently, deformation of the main body side wall 420 due to an excessive pressing force on the plurality of contact points 471 can be reduced. In this manner, the plurality of contact points 471 is placed in contact in a stable configuration with the main body side wall 420.

Therefore, the shielding performance of the shielding case 400 can be stabilized.

The fixing threaded member 404 fixes the lid 402 and the cabinet main body 401 in a state in which the threaded fitting direction D differs from the direction of biasing of the plurality of contact points 471. Consequently, after fixing the lid 402 and the cabinet main body 401 with the fixing threaded members 404, the biasing force of the plurality of contact points 471 is inhibited from acting on the fixing threaded members 404. Therefore, the fixing threaded members 404 maintain the fixed state of the lid 402 and the cabinet main body 401. Therefore, the shielding performance of the shielding case 400 can be maintained.

The cabinet main body 401 includes the main body outer edge portion 430. Consequently, the rigidity of the end side on the opening 403 side of the main body side wall 402 is high. In this manner, the plurality of contact points 471 abuts with a portion with high rigidity. Therefore, the plurality of contact points 471 abuts stably with the main body side wall 420 in a state in which deformation of the main body side wall 420 that is caused by the pressing force of the plurality of contact points 471 is reduced. Therefore, the shielding performance of the shielding case 400 can be stabilized.

The plurality of projections 473 of the plurality of contact points 471 is formed on the distal end on the free end side. Consequently, the plurality of projections 473 abuts with the main body side wall 420 in a state in which the flexure amount of the plurality of biasing portions 472 is low. In this manner, the space between the plurality of biasing portions 472 and the main body side wall 420 formed by the flexure of the plurality of biasing portion 472 can be reduced. Therefore, noise that leaks from the space formed by the flexure of the plurality of contact points 471 can be reduced.

In the present embodiment, the interval between the plurality of contact points 471 is set in response to the regulated noise frequency.

For example, the interval between the plurality of contact points 471 is not fixed. Therefore, the possibility of functioning as a dipole antenna is reduced.

Furthermore, the interval between the plurality of contact points 471 is set so that the noise frequency that is leaked from the slight groove formed by the interval of the plurality of contact points 471 do not coincide with the frequency that is regulated by an EMI standard (for example, 30 MHz to 6 GHz). Consequently, the shielding case 400 can reduce the radiation of noise of a predetermined frequency.

The following effects for example are obtained by the shielding case 400 for a copying machine 1 according to the present embodiment.

A cabinet main body 401 and a lid 402 are included in the shielding case 400 according to the present embodiment. The electrically conductive cabinet main body 401 has an opening 403 and accommodates the board 600 for mounting of electronic components 601, and includes a main body side wall 420 such that a portion of the main body side wall 420 forms an opening 403, and a main body outer edge portion 430 formed continuously on the end on the side with the opening 403 in the main body side wall 420 and extending to an outer side of the opening 403. The lid 402 is an electrically conductive lid that is disposed to cover the opening 403. The lid 402 includes an opposed outer edge portion 480, a recessed portion 450 and a plurality of contact points 471. The opposed outer edge portion 480 is disposed opposite the main body outer edge portion 430. The recessed portion 450 includes an opposed side wall portion 470 that is connected with the opposed outer edge portion 480 and is disposed opposite the main body side wall 420, and a lid bottom portion 460 such that the outer edge of the lid bottom portion 460 is connected with the end on the opposite side to the opposed outer edge portion 480 in the opposed side wall portion 470. The plurality of contact points 471 is formed on the opposed side wall portion 470. The plurality of contact points 471 is biased toward the main body side wall 420 and electrically connects the cabinet main body 401 and the lid 402.

As a result, a stable electrical connection between the cabinet main body 401 and the lid 402 is possible by biasing the plurality of contact points 471 towards the main body side wall 420. In this manner, high frequency noise that is radiated from the electronic components 601 on the side with the lid 402 flows onto the side with the cabinet main body 401. Therefore, the shielding case 400 according to the present embodiment enhances the shield performance in relation to high frequency noise.

Furthermore, the plurality of contact points 471 is formed on the opposed side wall portion 470. Consequently, a another member for enhancing the shield performance is not required. Therefore, the cost required in relation to the another member for enhancing the shield performance can be reduced.

The shielding case 400 according to the present embodiment includes a main body outer edge portion 430. Consequently, the rigidity of the end on the opening 403 side of the main body side wall 420 is high. In this manner, the deformation of the main body side wall 420 resulting from the pressing force of the plurality of contact points 471 is reduced. Therefore, the shield performance of the shielding case 400 can be stabilized.

Furthermore, the opposed outer edge portion 480 and the main body edge portion 430 are disposed in an opposed configuration in a state of extending toward an outer side of the opening 403. Consequently, the opposed outer edge portion 480 and the main body edge portion 430 overlap, and a configuration is realized that inhibits leakage of high frequency noise from between the opposed outer edge portion 480 and the main body edge portion 430. In this manner, the shielding case 400 enhances the shield performance in relation to high frequency noise.

Furthermore, the contact points 471 in the shielding case 400 according to the present embodiment are formed by a notch in the opposed side wall portion 470. The contact points 471 include a biasing portion 472 and a projection 473. The biasing portion 472 has a free end. The projection 473 is formed on the surface on the main body side wall 420 side with the free end of the biasing portion 472, and projects towards the main body side wall 420 side. When the lid 402 is fitted to the cabinet main body 401, the biasing portion 472 has a configuration that includes an elastic force due to flexing toward the opposite side to the main body side wall 420. The projection 473 abuts with the main body side wall 420 by biasing toward the main body side wall 420 with the biasing portion 472.

As a result, the deviation of the pressing force of the plurality contact points 471 due to assembly can be reduced. In this manner, the plurality of contact points 471 abuts with a stable pressing force on the main body side wall 420. Therefore, the shield performance of the shielding case 400 can be stabilized.

The plurality of contact points 471 of the lid 402 is biased toward the main body side wall 420 of the cabinet main body 401 and abuts with a stable pressing force with the main body side wall 420 of the cabinet main body 401 merely by fitting the lid 402 to the cabinet main body 401. As a result, the shield performance can be maintained with a simple configuration by merely fitting the lid 402 to the cabinet main body 401.

Furthermore, the shielding case 400 of the present embodiment includes a main body side engaging projection 432 (locating portion) that is formed on the main body outer edge portion 430, and a lid side engaging hole 482 (located portion) that is formed on the opposed outer edge portion 480 and engages with the main body side engaging projection 432 to regulate the location of the lid 402 in the direction of extension of the main body outer edge portion 430.

Consequently, position (movement) in the Y-X plate direction of the lid 402 is regulated in a configuration in which the contact points 471 are stably biased by a fixed pressing force onto the main body side wall 420. In this manner, the plurality of contact points 471 abuts stably with the main body side wall 420 in a state in which the deviation of the pressing force of the contact points 471 is reduced. Therefore, the shield performance of the shielding case 400 can be stabilized.

Furthermore, the shielding case 400 according to the present embodiment includes fixing threaded members 404 for fixing the lid 402 to the cabinet main body 401, by inserting the fixing threaded members 404 in the threaded fitting direction D (fitting direction) that is the direction of fitting of the fixing threaded members 404, and fixing the lid 402 and the cabinet main body 401. The plurality of contact points 471 is biased in a direction that is intersected with the threaded fitting direction D and electrically connects the cabinet main body 401 and the lid 402.

Consequently, the threaded fitting direction D differs from the direction in which the plurality of contact points 471 is biased. As a result, the operation characteristics when fixing the cabinet main body 401 and the lid 402 by use of the fixing threaded members 404 can be enhanced.

After fixing the cabinet main body 401 and the lid 402 by use of the fixing threaded members 404, a biasing force of the plurality of contact points 471 is inhibited from acting on the fixing threaded members 404. Consequently maintenance of a fixed state in relation to the cabinet main body 401 and the lid 402 is facilitated. Therefore, stable shield performance of the shielding case 400 can be maintained.

The interval between the plurality of contact points 471 in the shielding case 400 according to the present embodiment is set in response to the regulated noise frequency.

For example, the interval between the plurality of contact points 471 is not fixed. Consequently, the possibility of function as a dipole antenna is reduced.

Furthermore, the interval between the plurality of contact points 471 is set so that the noise frequency that is leaked from the slight groove formed by the interval of the plurality of contact points 471 do not coincide with the frequency that is regulated by an EMI standard (for example, 30 MHz to 6 GHz). Consequently, the shielding case 400 can reduce the radiation of noise of a predetermined frequency.

Although the preferred embodiments have been described, this disclosure is not limited to the above embodiments, and the disclosure may be implemented in various aspects.

For example, although the interval between the plurality of contact points 471 was not fixed in the above embodiment, there is no limitation in this regard. The interval between the plurality of contact points 471 may be fixed. For example, the plurality of contact points 471 may be set to an interval of less than λ/4 of the maximum frequency wave length that is regulated.

In the above embodiments, the biasing portions 472 of the contact points 471 are formed at a position and in an orientation so that the end on the side with the opening in the shape of a letter U of the U-shaped groove 474 forming the biasing portion 472 is located on the end on the side with the lid bottom portion 460 in the opposed side wall portion 470. The orientation and the position of the U-shaped groove 474 forming the biasing portion 472 are not limited to the above. For example, the end on the side with the opening in the shape of a letter U of the U-shaped groove 474 forming the biasing portion 472 may be formed in an orientation toward the Z direction.

In the above embodiments, the plurality of contact points 471 was formed integrally on the lid 402, however there is no limitation in this regard. For example, the plurality of contact points 471 may be configured by a plate spring member or the like as a another member. The cabinet main body 401 and the lid 402 may be electrically connected by the biasing force of the plate spring member or the like by disposing the plate spring member or the like between the main body side wall 420 of the cabinet main body 401 and the opposed side wall portion 470 of the lid 402.

The type of image forming apparatus according to the present disclosure is not limited and includes a printer, a facsimile, or a multifunction peripheral combining such devices in addition to a copying machine.

Furthermore, the sheet material is not limited to paper, and for example, includes a film sheet.

The invention claimed is:

1. A shielding case comprising a cabinet main body and a lid; the cabinet main body is an electrically conductive cabinet main body that accommodates a board for mounting electronic components and has an opening, the cabinet main body includes a main body side wall and a main body outer edge portion, a part of the main body side wall forms the opening, and the main body outer edge portion forming a connection with the end portion of the opening side in the main body side wall and extending to the outer side of the opening, and the lid is an electrically conductive member that is disposed to cover the opening,
and comprises opposed outer edge portions that are opposed to the main body outer edge portion,
a recessed portion that includes opposed side wall portions that are connected to the opposed outer edge portions and disposed in an opposed configuration in relation to the main body side wall, and a lid bottom plate portion such that the outer edge of the lid bottom plate portion is connected to the end opposite the opposed outer edge portions in the opposed side wall portions, and
a plurality of contact points that is formed on the opposed side wall portions, and is biased toward the main body side wall to form an electrical connection between the cabinet main body and the lid,
wherein each of contact points comprise a biasing portion and a projection;
the biasing portion is surrounded by the opposed side wall portion at which a notch shaped like a letter U is provided, and has a free end that is formed on the opposed outer edge portion and extends from the fixed end that is connected to the lid bottom plate portion,
the projection is formed on a surface on the main body side wall side on the free end side of the biasing portion, and projects to the main body side wall side, wherein
in a state in which the lid is attached to the cabinet main body with the lid bottom plate portion being inserted into the opening of the cabinet main body such that the lid bottom plate portion is located deeper than the main body outer edge portion, the biasing portion is configured to flex towards the side opposite to the main body side wall and exhibit an elastic force, and the projection abut with the main body side wall in a state of being biased towards the main body side wall by the biasing portion.

2. The shield case according to claim 1, further comprising: a locating portion that is formed on the main body outer edge portion; and
a located portion that is formed on the opposed outer edge portion and engages with the locating portion to regulate the location of the lid in the direction of extension of the main body outer edge portion.

3. The shield case according to claim 1, further comprising: a fixing member for fixing the lid to the cabinet main body, the fixing member displacing in a fitting direction for fitting the fixing member to fix the lid and the cabinet main body, and
the plurality of contact points is biased in a direction that is intersected with the fitting direction, and forms an electrical connection between the cabinet main body and the lid.

4. The shield case according to claim 1, where the interval between the plurality of contact points is set in response to the frequency of the regulated noise.

5. A shielding case comprising an electrically conductive cabinet main body that accommodates a board for mounting electronic components and has an opening,
an electrically conductive lid that is disposed to lid the opening,
a fixing member for fixing the lid to the cabinet main body, the fixing member displaced in a fitting direction for fitting the fixing member to fix the lid and the cabinet main body, and
a plurality of contact points that is biased in a direction that is intersected with the fitting direction, and forms an electrical connection between the cabinet main body and the lid,
wherein the cabinet main body includes a main body side wall and a main body outer edge portion, a part of the main body side wall forms the opening, the main body outer edge portion forming a connection with the end portion of the opening side in the main body side wall and extending to the outer side of the opening, and the lid comprising:

opposed outer edge portions that are opposed to the main body outer edge portion, a recessed portion that includes opposed side wall portions that are connected to the opposed outer edge portions and disposed in an opposed configuration in relation to the main body side wall, and a lid bottom plate portion such that the outer edge of the lid bottom plate portion is connected to the end opposite the opposed outer edge portions in the opposed side wall portions, and the plurality of contact points that is formed on the opposed side wall portions, and is biased toward the main body side wall to form an electrical connection between the cabinet main body and the lid, wherein the connection points comprise a biasing portion and a projection;

the biasing portion is surrounded by the opposed side wall portion at which a notch shaped like a letter U is provided, and has a free end that is formed on the opposed outer edge portion and extends from the fixed end that is connected to the lid bottom plate portion, the projection is formed on a surface on the main body side wall side on the free end side of the biasing portion, and projects to the main body side wall side, wherein in a state in which the lid is attached to the cabinet main body with the lid bottom plate portion being inserted into the opening of the cabinet main body such that the lid bottom plate portion is located deeper than the main body outer edge portion, the biasing portion is configured to flex towards the side opposite to the main body side wall and exhibit an elastic force, and the projection abut with the main body side wall in a state of being biased towards the main body side wall by the biasing portion.

6. The shield case according to claim 5, further comprising a locating portion that is formed on the main body outer edge portion; and a located portion that is formed on the opposed outer edge portion and engages with the locating portion to regulate the location of the lid in the direction of extension of the main body outer edge portion.

7. The shield case according to claim 5, where the interval between the plurality of contact points is set in response to the frequency of the regulated noise.

8. An imaging forming apparatus comprising: an image forming unit for forming an image on an image forming material, an electrically conductive housing for accommodating the image forming unit, and the shielding case according to claim 1 for forming an electrical connection with the housing.

\* \* \* \* \*